(12) United States Patent
Morse

(10) Patent No.: US 6,534,857 B1
(45) Date of Patent: Mar. 18, 2003

(54) THERMALLY BALANCED POWER TRANSISTOR

(75) Inventor: Alfred W. Morse, Ellicott City, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/985,402

(22) Filed: Nov. 2, 2001

(51) Int. Cl.⁷ .................. H01L 23/06; H01L 23/15; H01L 23/02
(52) U.S. Cl. .................. 257/705; 257/678; 257/679
(58) Field of Search .................. 257/142, 146, 257/197, 212, 29.262, 705, 675, 678, 708, 690

(56) References Cited

U.S. PATENT DOCUMENTS

| | | | | |
|---|---|---|---|---|
| 3,602,705 A | * | 8/1971 | Cricchi et al. ............ | 708/707 |
| 4,473,762 A | * | 9/1984 | Iwahashi et al. ........... | 327/262 |
| 4,991,916 A | * | 2/1991 | Deaver ..................... | 330/263 |
| 5,408,128 A | * | 4/1995 | Furnival ................... | 257/690 |
| 5,585,288 A | * | 12/1996 | Davis et al. ............... | 438/174 |
| 5,917,204 A | * | 6/1999 | Bhatnagar et al. .......... | 257/142 |
| 6,078,194 A | * | 6/2000 | Lee ......................... | 326/116 |
| 6,078,501 A | * | 6/2000 | Catrambone et al. ....... | 257/712 |
| 6,146,926 A | * | 11/2000 | Bhatnagar et al. ..... | 257/29.262 |
| 6,204,554 B1 | * | 3/2001 | Ewer et al. ................ | 257/705 |

* cited by examiner

Primary Examiner—John F. Niebling
Assistant Examiner—Walter L. Lindsay, Jr.
(74) Attorney, Agent, or Firm—Birch, Stewart, Kolasch & Birch, LLP

(57) ABSTRACT

A high power transistor structure comprised of a plurality of field effect transistors fabricated in parallel on a common semiconductor chip and wherein the gate electrodes of the field effect devices are in the form of parallel finger elements having a variable pitch between the fingers which decreases uniformly or non-uniformly from a central portion of the cell to opposite outer end portions thereof.

16 Claims, 3 Drawing Sheets

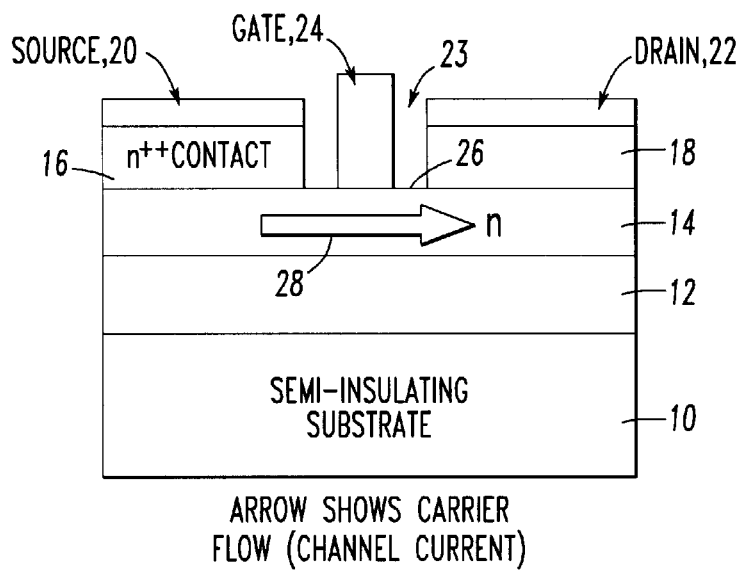
FIG. 1
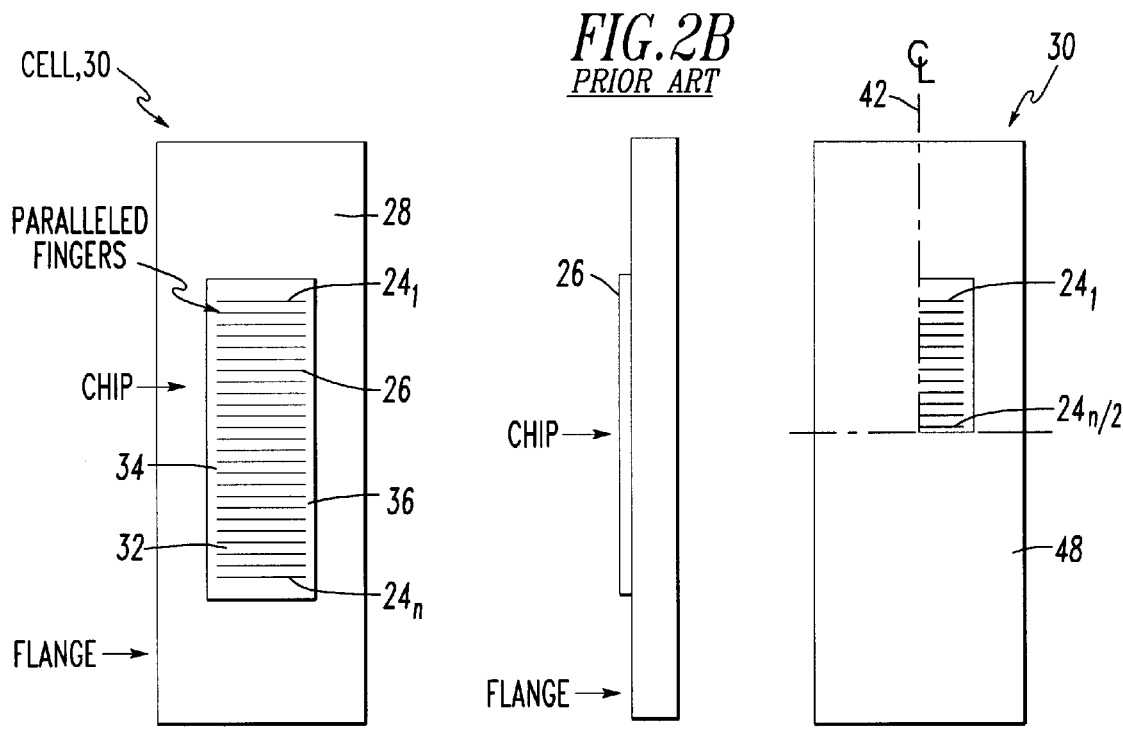
FIG. 2A PRIOR ART
FIG. 2B PRIOR ART
FIG. 3 PRIOR ART

THERMALLY BALANCED POWER TRANSISTOR

BACKGROUND OF THE INVENTION

1. Field of the Invention

This invention relates generally to semiconductor devices and more particularly to a high frequency field effect transistor power cell consisting of a plurality of same type of field effect transistor devices fabricated side-by-side and connected in parallel on a common semiconductor chip.

2. Description of Related Art

Field effect transistor (FET) devices are well known in the art. A typical FET device is shown in FIG. 1 and consists of a semi-insulating substrate 10, an undoped buffer layer 12, and an upper layer 14 which is doped with a semiconductivity type dopant, typically n-type semiconductor material. The doped upper layer 14 forms an active region which implements a current channel between source and drain contact regions 16 and 18 on which is formed source and drain connection terminals or electrodes 20 and 22. The source and drain regions 16 and 18 are separated from one another by a space 23 including a gate electrode 24 which is formed on the surface 26 of the active layer 14. The gate 24 acts to modulate the current in the channel beneath it as current traverses between the source and drain electrodes 20 and 22.

The dimension of the gate 24 parallel to the current flow shown by the arrow 28 in FIG. 1 is called the "gate length" and comprises the most critical dimension for the determination of high frequency response. The gate dimension into the paper and as shown in FIG. 2A, is called the "gate width" and determines the power of the device because total current flow is proportional to the gate width. Typical dimensions for the gate length are 0.25 to 0.75 microns ($10^{-6}$ m), while the gate width is loosely limited to something less than 100 to 400 microns, depending upon the particular design.

High power levels are typically obtained by forming a cell 30 of multiple FET devices in parallel on a common semiconductor chip 26, such as silicon carbide (SiC), as shown in FIGS. 2A and 2B. There, reference numeral 28 denotes a metal flange on which the chip 26 is mounted. As shown in FIG. 2A, the combination of a plurality of parallel gate-source-drain structures having equal width gates $24_1 \ldots 24_n$ is referred to as a cell, as indicated by reference numeral 30. The width of the cell 30 is the width of each individual gate $24_1 \ldots 24_n$ while the length of the cell is the number of gates times the "pitch" which is the distance 32 between neighboring gates such as gates $24_1$ and $24_2$.

The cell 30 generates waste heat from each of the individual gate fingers $24_1 \ldots 24_n$, which effectively becomes an area heat source in the overall cell. The waste heat from the cell area is mostly conducted downwardly through the chip to the metal flange, although the downward path is somewhat increased by the lateral spreading from the edges 34 and 36 in the longitudinal direction toward the end regions 38 and 40 (FIG. 5).

The temperature rise due to waste heat adversely affects the transistor performance and reliability. Thermal design of the cell and transistor chip is therefore a critical part of the overall design of a high performance power FET device. The chip is typically thinned as much as possible in the width direction to minimize thermal impedance, while the area power density in the cell is controlled by limiting the finger-to-finger spacing or pitch. A small gate width, therefore, to the cell is preferably in order to maximize the level of spreading of the heat flow.

SUMMARY

Accordingly, it is an object of the present invention to provide an improvement in semiconductor devices.

It is another object of the invention to provide an improvement in power transistors.

And it is a further object of the present invention to provide an improvement in field effect power transistors.

And it is yet another object of the invention to provide thermal balance in a cell of field effect transistors residing on a common semiconductor chip.

These and other objects are achieved by a high power transistor structure comprised of a plurality of field effect transistors fabricated in parallel on a common semiconductor chip and wherein the gate electrodes of the field effect devices are in the form of parallel finger elements having a variable pitch between the fingers which decreases, such as uniformly or non-uniformly, from a central portion of the cell to opposite outer end portions thereof. The variable finger pitch results in a much more uniform temperature distribution with a lower peak temperature. Such an implementation of gate fingers operates to improve reliability as well as eliminating the fighting between fingers due to temperature-driven gain and phase variances.

Further scope of applicability of the present invention will become apparent from the detailed description provided hereinafter. It should be understood, however, that the detailed description and specific example, while disclosing the preferred embodiment of the invention, it is provided by way of illustration only inasmuch as various changes and modifications coming within the spirit and scope of the invention will become apparent to those skilled in the art from the following detailed description.

BRIEF DESCRIPTION OF THE DRAWINGS

The present invention will become more fully understood when the detailed description of the invention is considered in conjunction with the accompanying drawings which are provided by way of illustration only and are thus not meant to be considered in a limiting sense, and wherein:

FIG. 1 is a cross sectional view generally illustrative of a single gate field effect transistor device in accordance with the known prior art;

FIGS. 2A and 2B are illustrative of top planar and side planar views of a cell of like field effect transistor devices having mutually parallel elongated finger type gate electrodes fabricated in a common semiconductor chip in accordance with the known prior art;

FIG. 3 is a partial top planar view of the semiconductor cell shown in FIG. 2A and is representative of one quadrant of the cell shown thereat;

DETAILED DESCRIPTION OF THE INVENTION

Figure 4:
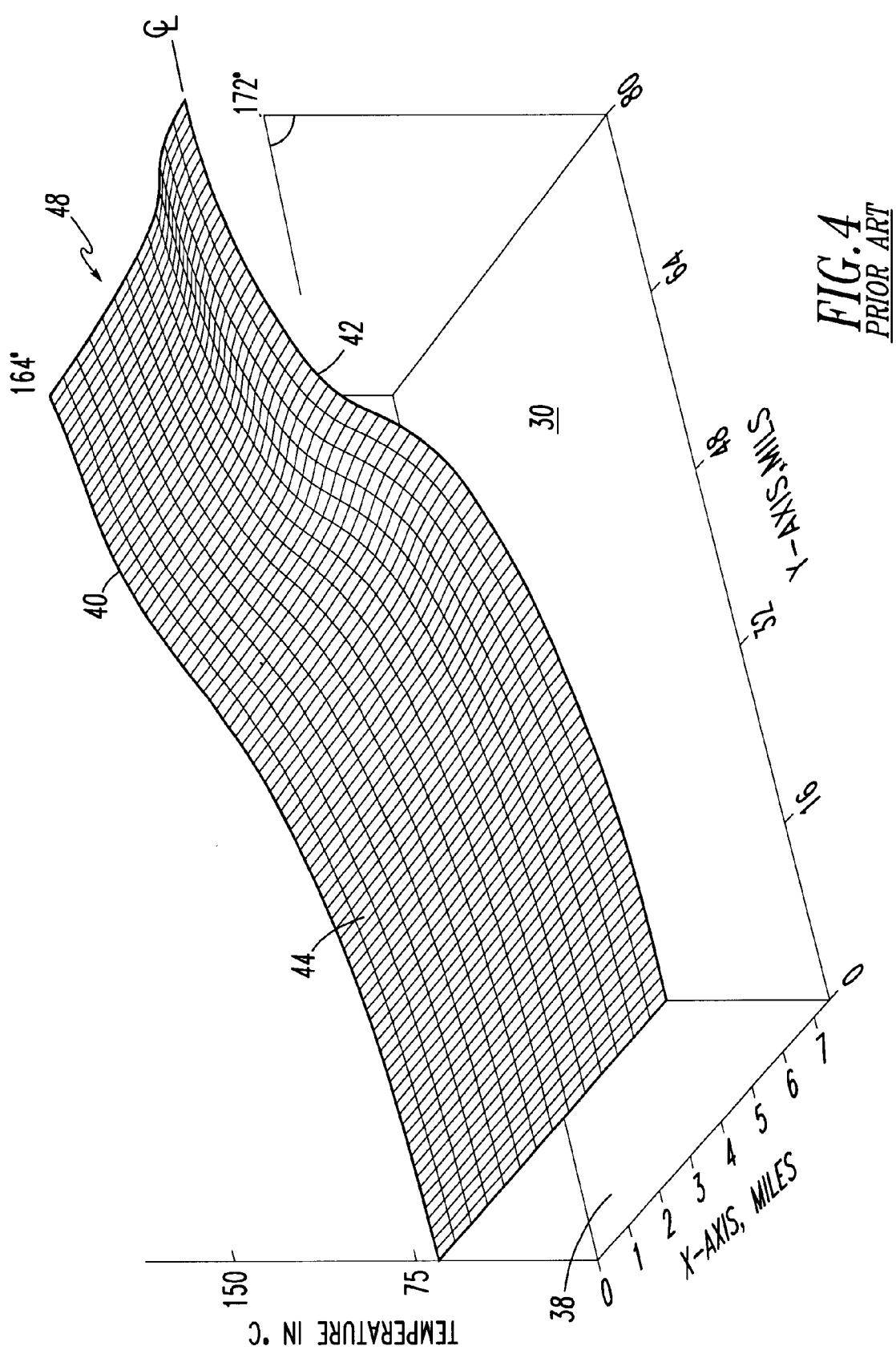
FIG. 4 is illustrative of temperature distribution over the quadrant of the cell shown in FIG. 3.

Power transistors are typically constructed by fabricating many individual devices in parallel. As already described above, a high power field effect transistor (FET) cell 30, in accordance with the known prior art, includes a plurality of field effect transistors fabricated on a common semiconductor chip 36 and having respective gate fingers, for example as shown by reference numeral $24_1 \ldots 24_n$ in FIG. 2A, connected in parallel. Such a cell structure has a large internal thermal variation along its length. It is this thermal variation which degrades performance.

The critical figure of merit for FET thermal design is °C./W/mm where °C./W is the temperature rise of the cell per watt dissipated and mm is the number of millimeters of total gate width, i.e., length of a gate electrode across the cell 30 added up in all of the cell fingers $24_1 \ldots 24_n$. When the °C./W/mm number is known, the achievable performance of a cell, such as cell 30, can be computed, starting at a reference performance with no thermal affects.

Figure 5:
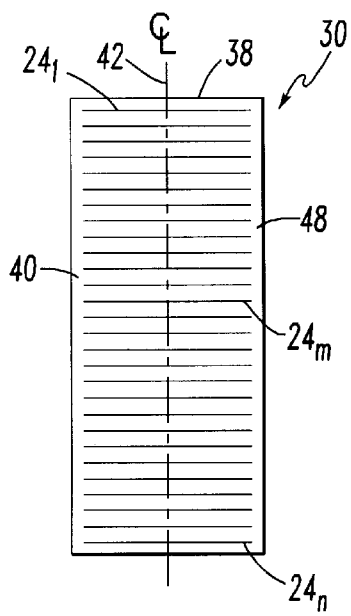
FIG. 5 is an enlarged top planar view of the field effect transistor cell shown in FIG. 2A.

A thermal rise in a FET cell can be computed by "Finite Element Analysis". Due to the symmetry of a cell 30 such as shown in FIGS. 2A and 5, only one quarter of a chip needs to be calculated. Accordingly, a typical temperature distribution over the quadrant, (FIG. 3) of the cell 30, is depicted in FIG. 4. There reference numeral 38 denotes one outer end of the cell 30, reference numeral 40 denotes one outer edge of the cell, and reference numeral 42 denotes the center line of the cell. FIG. 4 is illustrative of the temperature distribution of a silicon carbide (SiC) FET cell 30 consisting of n=48 fingers 24 having a length of 100 microns long (gate width) and a finger pitch of 30 microns. The temperature surface plot 44 depicts the temperature profile down the center line 42 of the cell quadrant shown in FIG. 3 as well as out to the outer edge 40. The hot spot temperature in the middle portion 48 of the cell 30 along center line 42 is about 172° C. and drops off to about 65° at the outer end 38. Across the short dimension 50 of the cell 30, the temperature drops off to about 164° at the edge 40 of the cell.

Figure 6:
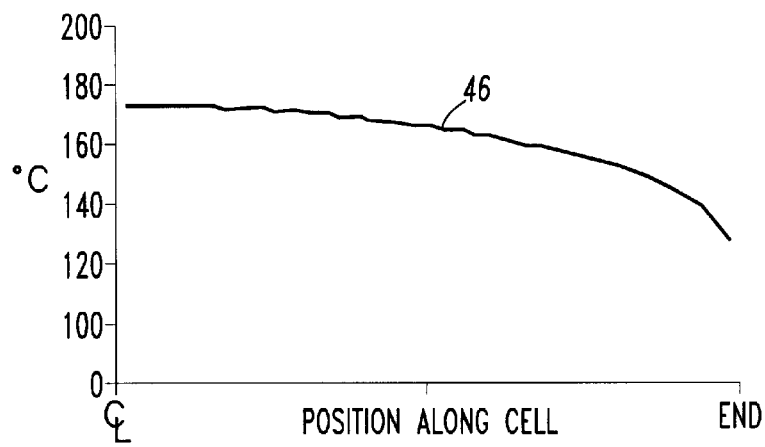
FIG. 6 is a graph illustrative of the temperature variation along the center of the cell quadrant shown in FIG. 3 from the middle to the other end.

FIG. 6 depicts a characteristic curve 46 which is illustrative of the temperature variation along the center line 42 of the cell quadrant shown in FIG. 3. The plot of temperature in. FIG. 6 extends from the middle portion 48 of the cell 30 outward to the end portion 38. A full cell is symmetric in the opposite direction as well.

It can be seen that a conventional FET cell 30 such as shown, for example, in FIG. 5 has a wide distribution of temperatures across its area even if the shape is relatively thin or narrow across its width in an attempt to maximize edge spreading per unit area. The greatest range of temperatures in the cell 30 is along, the center line 42. This temperature differential indicates that the end fingers adjacent the first finger $24_1$ and last finger $24_n$ are operating at quite different thermally-driven electrical parameters than that of the fingers adjacent the finger $24_m$ in the middle region of the cell 30.

There exists at least two extremely undesirable consequences of this temperature differential, namely: (1) the gain of an FET device such as cell 30 typically has a temperature coefficient of about 0.012 db/degree. Accordingly, the fingers in the vicinity of the center finger $24_m$, as shown in FIG. 5 have 0.55 db less gain in power than the end fingers $24_1$ and $24_n$; (2) SiC FETs have been measured to change about 0.26 electrical degrees per degrees C. This puts an inherent phase imbalance of 12° between the various fingers $24_1 \ldots 24_n$ in the same cell 30.

The consequences of these gain and phase balances are hard to quantify due to the fact that the fingers $24_1 \ldots 24_n$, which are all tied together in parallel by gold buses, not shown, fight each other. When paralleled modules, transistors, cells or fingers fight each other, the result is lower overall gain, power and efficiency. This is one reason that large, high powered multi-finger devices exhibit lower performance than single-finger devices.

Figure 7:
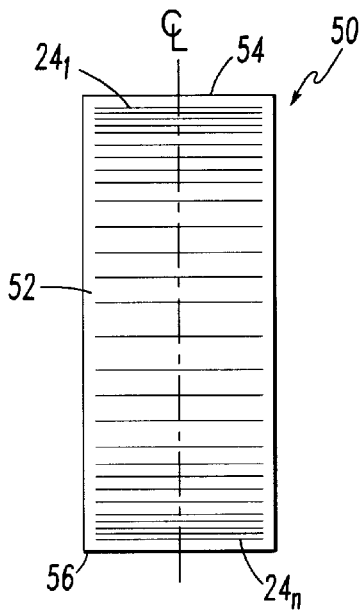
FIG. 7 is a top planar view of the gate finger distribution of a field effect transistor cell in accordance with the preferred embodiment of the subject invention.
Figure 8:
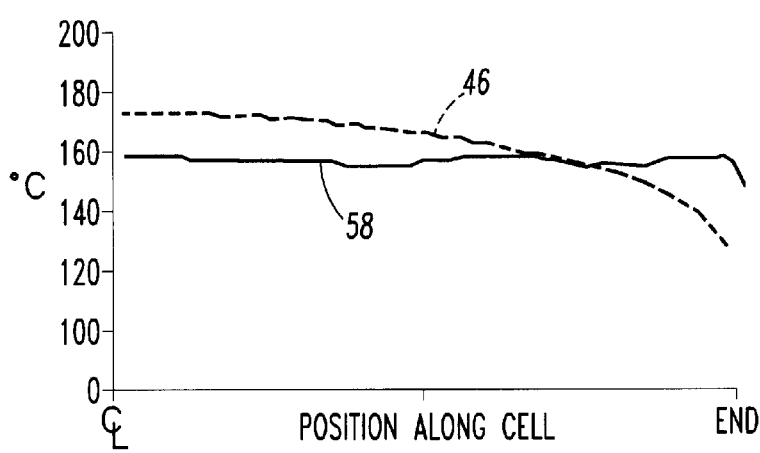
FIG. 8 is a graph illustrative of the temperature distribution along the center of the cell shown in FIG. 7 in relation to that of FIG. 5.

Accordingly, the cell temperature variance can be greatly reduced if a cell 30 is constructed so that a variable pitch is provided between the fingers $24_1 \ldots 24_n$ by providing a distribution of fingers wherein the pitch is greater at the middle of cell 30 than at the ends. Such an embodiment is shown in FIG. 7 where a multiple FET cell 50 is shown including a plurality of gate finger electrodes $24_1 \ldots 24_n$ where the pitch between the fingers, while equal in number to those shown in FIG. 5, decreases as one moves from the center or center region 52 toward opposite outer ends of the cell 50 shown by reference numerals 54 and 56. Such a configuration provides a much more uniform temperature distribution as shown by the curve 58 shown in FIG. 8 in comparison to the curve of 46 which is illustrative of the temperature distribution of an equally spaced finger configuration of FIG. 5. A structure such as shown in FIG. 7 improves reliability and substantially eliminates the fighting between fingers due to temperature-driven gain in phase variances.

While both a uniform and a non-uniform variation of pitch can be used, an example of a non-uniform distribution which is easily implemented in a cell mask layout is one where starting at the center or middle region 52 of the cell 50 and moving outward, ten (10) fingers are spaced at 38 $\mu$m, eight (8) fingers are spaced at 30 $\mu$m, three (3) fingers are spaced at 22 $\mu$m, and three (3) fingers are spaced at 13 $\mu$m.

While such dimensions are not necessarily optimum, they are easily implementable and do not affect the critical source-gate-drain dimensions at the finger level. Since the design of each individual finger and channel is not affected, there will be no inherent change in finger-level electrical performance, and the only change is a cell-level improvement in peak temperature and finger-to-finger uniformity due to the electrical temperature coefficients.

Thus what has been shown and described is a variable power density FET constructed by parallel connection of gate finger electrodes of a plurality of field effect transistors, the length and width of which determines the basic frequency response and other electrical parameters of the aggregate on a normalized, per mm of periphery basis. The variable power density occurs at the cell level where the plurality of the basic finger structures are connected in parallel, with distances between the structures determined by overall thermal considerations and where the finger distribution lowers the peak temperature of a power transistor cell while at the same time minimizing electrical differences between fingers caused by thermal effects of neighboring finger structures. This invention, therefore, is applicable to any FET device, in any semiconductor material, where the characteristics of each elemental finger structure are not electrically altered by the proximity of other finger structures.

The foregoing detailed description merely illustrates the principles of the invention. It will thus be appreciated that those skilled in the art will be able to devise various arrangements which although not explicitly described or shown herein, embody the principles of the invention and are thus within its spirit and scope.

What is claimed is:

1. A high power thermally balanced semiconductor device comprising:
   a plurality of like elemental semiconductor devices, having first and second current conducting terminals and a control terminal, aligned side-by-side in a common semiconductor chip, and,
   wherein the control terminals are connected in parallel and individually spaced so that the mutual separation between immediately adjacent control terminals is varied in a predetermined manner from a central region of the semiconductor chip to opposing outer end regions thereof.

2. The semiconductor device as defined by claim 1 wherein the mutual separation decreases from the central region to the outer end regions.

3. The semiconductor device as defined by claim 2 wherein said elemental semiconductor devices comprise transistors.

4. The semiconductor device as defined by claim 1 wherein said elemental semiconductor devices comprise field effect transistors, the first and second current conducting terminals thereof comprise source and drain terminals, and the control terminal comprises a gate terminal located between the source and drain terminals.

5. The semiconductor device as defined by claim 4 wherein the gate terminals comprise elongated finger elements having a predetermined gate length and gate width and wherein the pitch between the fingers decreases from the central region of the semiconductor chip to the outer ends thereof.

6. The semiconductor device as defined by claim 5, said finger elements comprise generally linear finger elements.

7. The semiconductor device as defined by claim 6 wherein the fingers have substantially equal gate width dimensions.

8. The semiconductor device as defined by claim 6 wherein the pitch of said fingers decreases uniformly.

9. The semiconductor device as defined by claim 6 wherein the pitch of said fingers decrease non-uniformly.

10. A thermally balanced power transistor structure, comprising a plurality of field effect transistor devices fabricated in a common semiconductor chip, each field effect transistor device having a source, a drain and a gate electrode and wherein the gate electrodes comprise elongated finger elements connected in parallel and having a variable pitch between adjacent fingers so as to provide a substantially uniform temperature in the semiconductor chip.

11. A transistor structure according to claim 10 wherein the plurality of field effect transistor devices are located in mutual parallel relationship and the finger elements have substantially equal gate length and gate width dimensions.

12. A transistor structure according to claim 11 wherein the semiconductor chip comprises an elongated structure and the variable pitch comprises a pitch which varies between a relatively large pitch at middle or central region of the semiconductor chip and a relatively small pitch at the outer end regions thereof.

13. A transistor structure according to claim 12 wherein the variable pitch decreases from the middle or central region of the semiconductor chip outwardly to the outer end regions of the semiconductor chip.

14. A transistor structure according to claim 13 wherein the variable pitch decreases uniformly.

15. A transistor structure according to claim 13 wherein the variable pitch decreases non-uniformly.

16. A thermally balanced power field effect transistor structure, comprising: a plurality of field effect transistor devices fabricated side-by-side in a common semiconductor chip, each field effect transistor device having a source, a drain and a gate electrode and wherein the gate electrodes comprise elongated finger elements of like dimensions arranged in parallel and connected in parallel and having a pitch which varies uniformly or non-uniformly from a relatively large pitch in the control region of the chip to a relatively small pitch at the outer end regions thereof so as to provide a substantially uniform temperature in the semiconductor chip.

* * * * *